United States Patent
Gill et al.

(10) Patent No.: US 9,618,956 B2
(45) Date of Patent: Apr. 11, 2017

(54) ON-CHIP POWER-DOMAIN SUPPLY DROOPING FOR LOW VOLTAGE IDLE/STANDBY MANAGEMENT

(71) Applicant: Texas Instruments Incorporated, Dallas, TX (US)

(72) Inventors: Michael Gill, Plano, TX (US); Ramakrishnan Venkatasubramanian, Plano, TX (US); Shane Stelmach, Allen, TX (US); Jose Luis Flores, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/733,456

(22) Filed: Jun. 8, 2015

(65) Prior Publication Data
US 2016/0357210 A1 Dec. 8, 2016

(51) Int. Cl.
*G05F 3/02* (2006.01)
*H03K 17/687* (2006.01)

(52) U.S. Cl.
CPC .......... *G05F 3/02* (2013.01); *H03K 17/6872* (2013.01)

(58) Field of Classification Search
CPC ... G05F 1/00; G05F 1/465; G05F 1/56; G05F 1/575; G05F 3/00; G05F 3/02; G05F 3/30; G11C 5/00; G11C 5/147; H03K 17/00; H03K 17/6872
USPC ......................................... 327/540
See application file for complete search history.

(56) References Cited

U.S. PATENT DOCUMENTS

2009/0302821 A1* 12/2009 Kluge ............... G11C 5/14
323/311

* cited by examiner

*Primary Examiner* — Lincoln Donovan
*Assistant Examiner* — David Mattison
(74) *Attorney, Agent, or Firm* — Robert D. Marshall, Jr.; Charles A. Brill; Frank D. Cimino

(57) ABSTRACT

A power supply for an electronic circuit enables a low effort retention mode. During a normal mode a circuit module is supplied a first voltage sufficient for a controlled circuit to operate. During the low effort retention mode the circuit module is supplied with a second voltage lower than the first voltage. The second voltage is sufficient for flop-flops to retain their state but not sufficient to guarantee proper circuit operation. The second voltage is produced by a voltage drop (droop) from the first voltage. The preferred embodiment includes a System On Chip and one external voltage regulator and an on-chip droop circuit for each circuit module.

7 Claims, 5 Drawing Sheets

ON-CHIP POWER-DOMAIN SUPPLY DROOPING FOR LOW VOLTAGE IDLE/STANDBY MANAGEMENT

TECHNICAL FIELD OF THE INVENTION

The technical field of this invention is power supply control for electronic devices.

BACKGROUND OF THE INVENTION

A prior art System on Chip (SoC) employing semiconductor features sizes of 28 nm implements automatic dynamic voltage scaling (AVS) with an external voltage regulator. Typically the AVS is limited to a certain voltage range determined by the differential in voltages allowed between a static random access memory (SRAM) bit cell minimum voltage and surrounding logic. For this prior art device the AVS voltage is typically scaled between 1 V and 0.72 V.

The flip flop designs in the corresponding circuit library may retain their state at even lower voltages. In a known semiconductor manufacturing process, the retention voltage is around 0.5 V. Potential leakage current savings could be accomplished by lowering the voltage even below the typical automatic DVS scaled voltage. In an example digital signal processor of the Texas Instruments TMS320C6600 family, lowering the voltage below the AVS voltage could reduce the leakage current by 40 to 60% when the DSP is idle.

SUMMARY OF THE INVENTION

A power supply for an electronic circuit enables a low effort retention mode. During a normal mode a circuit module is supplied a first voltage sufficient for a controlled circuit to operate. During the low effort retention mode the circuit module is supplied with a second voltage lower than the first voltage. The second voltage is sufficient for flop-flops to retain their state but not sufficient to guarantee proper circuit operation. The two voltages can be produced by separate voltage regulators. The second voltage can be produced by a voltage drop (droop) from the first voltage. The preferred embodiment includes a System On Chip and two external voltage regulators or one external voltage regulators and an on-chip droop circuit for each circuit module.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
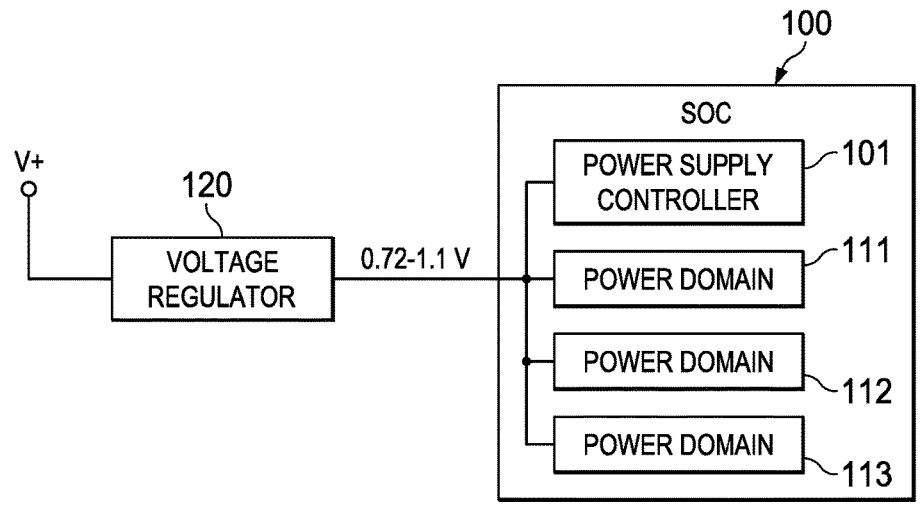
FIG. 1 illustrates a prior art system on chip system driven by a voltage regulator to which this invention is applicable.

FIG. 1 illustrates a typical prior art SOC power management scheme. System on chip (SOC) 100 includes power supply controller 101 and plural power domains 111, 112 and 113. Power domains 111, 112 and 113 represent parts of SOC 100 including useful circuits in separately controlled power domains. The number of such power domains and their exact function within SOC 100 are not important to this invention. External voltage regulator 120 supplies an adjustable voltage in the range from 1.1 V to 0.72 V from a power source. This power source may have a voltage of 3.3 V or of 1.8 V.

The state elements (flip flops and latches) within power domains 111, 112 and 113 may hold their state value at voltages as low as 0.5 V to 0.6 V. Typically the rest of SOC 100 circuits will not be functional at such a voltage. This could be due to the library characterization and timing closure not comprehending the lower voltage operation or the lower voltage could be outside the range of functional operation of SOC 100. Some part of SOC 100 may have to be functional all the time. These parts may include control power state sequencing circuits, clocks and the like. Thus the AVS input supply voltage to SOC 100 cannot be scaled to the lower voltage range of 0.5 V to 0.6 V. An entire separate power domain (typically implemented using power switches inside a physical design) can be lowered in voltage to the lower voltage range of 0.5 V to 0.6 V to implement a low effort retention scheme. Typically when a power domain is power-gated, the outputs are isolated, clocks are switched off etc. Upon entry into that mode, the voltage supply to the power domain can be lowered to enable a low voltage retention mode. This mode enables an additional retention state with very low effort and software can be modified to offer better idle/standby power management. As previously noted, most circuits will not operate at this reduced voltage. Because the power domain state is retained, recovery from the power down state to fully operation will be faster than recovery from a power OFF state.

This invention may be implemented in the following ways. A first embodiment employs multiple AVS power supplies. A second embodiment includes a single AVS power supply and all power domains capable of the low effort retention mode include internal power supply drooping to reach the lower voltage.

Figure 2:
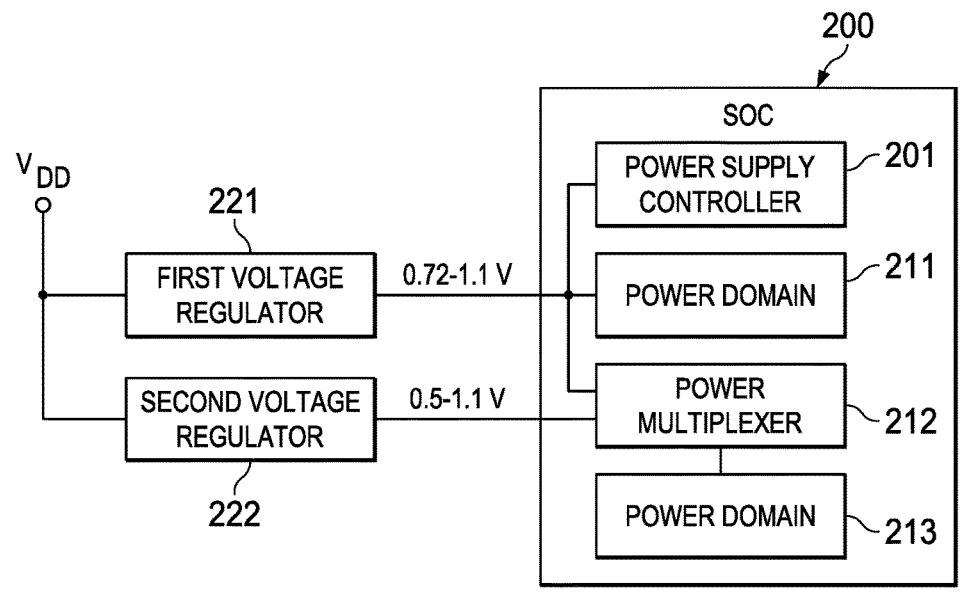
FIG. 2 illustrates a first embodiment of this invention employing two voltage regulators.

FIG. 2 illustrates an example of the first embodiment of this invention having plural AVSs. SOC 200 includes power supply controller 201 corresponding to power state controller 101 illustrated in FIG. 1. SOC 200 typically includes plural power supply domains as illustrated in FIG. 1. FIG. 2 illustrates a single power domain 211 as an example of a power domain that does not employ the low effort retention mode. Power domain 211 receives electric power directly from first voltage regulator in the same manner as power supply controller 201. SOC 200 may include plural such power domains. SOC 200 may further include one or more power domains which may enter the low effort retention mode. FIG. 2 illustrates power domain 213 as an example power domain that may enter the low effort retention mode. SOC 200 may include plural such power domains.

SOC 200 is supplied power by two AVSs. External first voltage regulator 221 supplies an adjustable voltage in the range from 1.1 V to 0.72 V from the power source. As described in conjunction with FIG. 1, this power source has a voltage of 3.3 V or of 1.8 V. Power from first voltage regulator 221 is supplied to power supply controller 201, power domain 211 and to power multiplexer 212. Second voltage regulator 222 supplies an adjustable voltage in the range from 0.5 V to 1.1 V from a power source 120. This second voltage is supplied to power multiplexer 212.

Power multiplexer 212 determines which power supply powers power domain 213. During normal operations power multiplexer 212 selects power from first voltage regulator 221. On entering the low effort retention mode power multiplexer 212 selects power from second voltage regulator 222. As noted above power domain 213 is typically power-gated, the outputs are isolated, clocks are switched off on entering the low effort retention mode in a manner not shown in FIG. 2.

Figure 3:
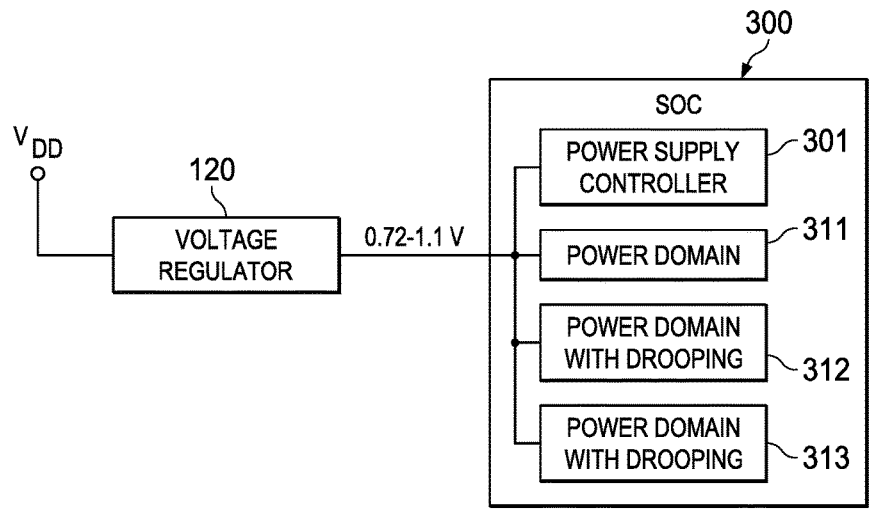
FIG. 3 illustrates a second embodiment of this invention employing a single voltage regulator where each controlled power domain includes a voltage drooping circuit.

FIG. 3 illustrates the second embodiment of this invention. SOC 300 includes power supply controller 301 similar to power supply controller 101 illustrated in FIG. 1 and power supply controller 201 illustrated in FIG. 2. FIG. 3 illustrates a single power domain 311 as an example of a power domain that does not employ the low effort retention mode. Power domain 311 receives electric power directly from voltage regulator 120 in the same manner as power supply controller 301. SOC 300 may include a plurality of such power domains. SOC 300 includes power domains with drooping 312 and 313. Each of power domains with drooping 312 and 313 receive electric power from voltage regulator 120. Voltage regulator 120 is similar to voltage regulator 120 illustrated in FIG. 1 and first voltage regulator 221 illustrated in FIG. 2. Voltage regulator 120 receives 3.0 V or 1.8 V input power and supplies an adjustable voltage in the range from 1.1 V to 0.72 V. During normal operations power domains 312 and 313 operate on power at the received voltage without implementing the built-in voltage droop. On entering the low effort retention mode the droop circuits in power domains 312 and 313 reduce the voltage of the supplied power to the retention mode voltage of 0.5 V to 0.6 V.

Table 1 lists a comparison of the electric power consumed and the time needed to recover full operation for various operating modes. The normal mode is fully powered. The clock gated mode supplies the full voltage to the circuit but freezes the clock inputs. The retention mode is this invention. The power gated mode removes both electric power and clocks from the circuit.

TABLE 1

| Mode | Relative Power Consumed | Recovery cycles/time |
|---|---|---|
| Normal | 1x | 0/0 |
| Clock Gated | 0.8x | 1 to 2 cycles/nS |
| Retention Mode | 0.1x to 0.3x | few 10's of cycles/nS |
| Power Gated | 0.01x | few 1000's of cycles/µS |

As shown in Table 1 this invention provides a good intermediate power level versus recovery time. This invention uses less power than clock gating the circuit and requires less recovery time than power gating the circuit.

State retention could be implemented in a SOC circuit using retention cells in the standard cell library. This technique is commonly used. This technique adds lot of effort including cell library development, characterization and power domain implementation. The on-chip supply drooping based retention of this invention implements full retention. With this invention cell library changes are limited to few standard cells. Thus this invention is scalable.

Figure 4:
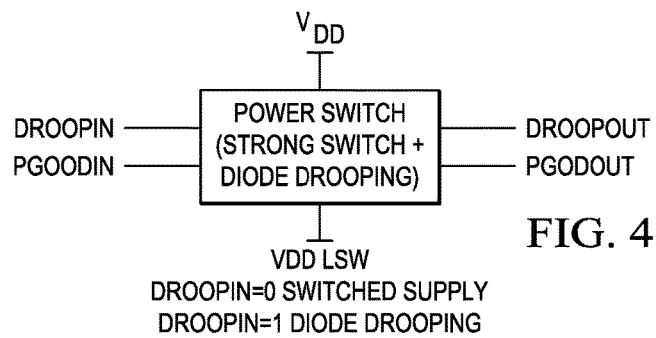
FIG. 4 illustrates the inputs and outputs of a power switch including a voltage drooping circuit according to the second embodiment of this invention.
Figure 5:
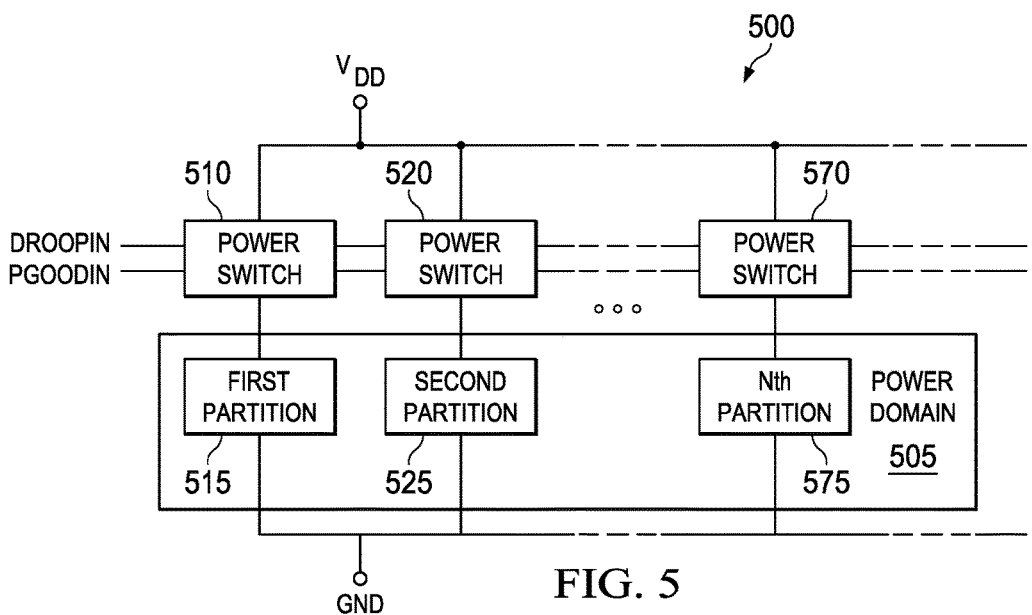
FIG. 5 illustrates the cooperation of a chain of the power switches illustrated in FIG. 4 are used.
Figure 6:
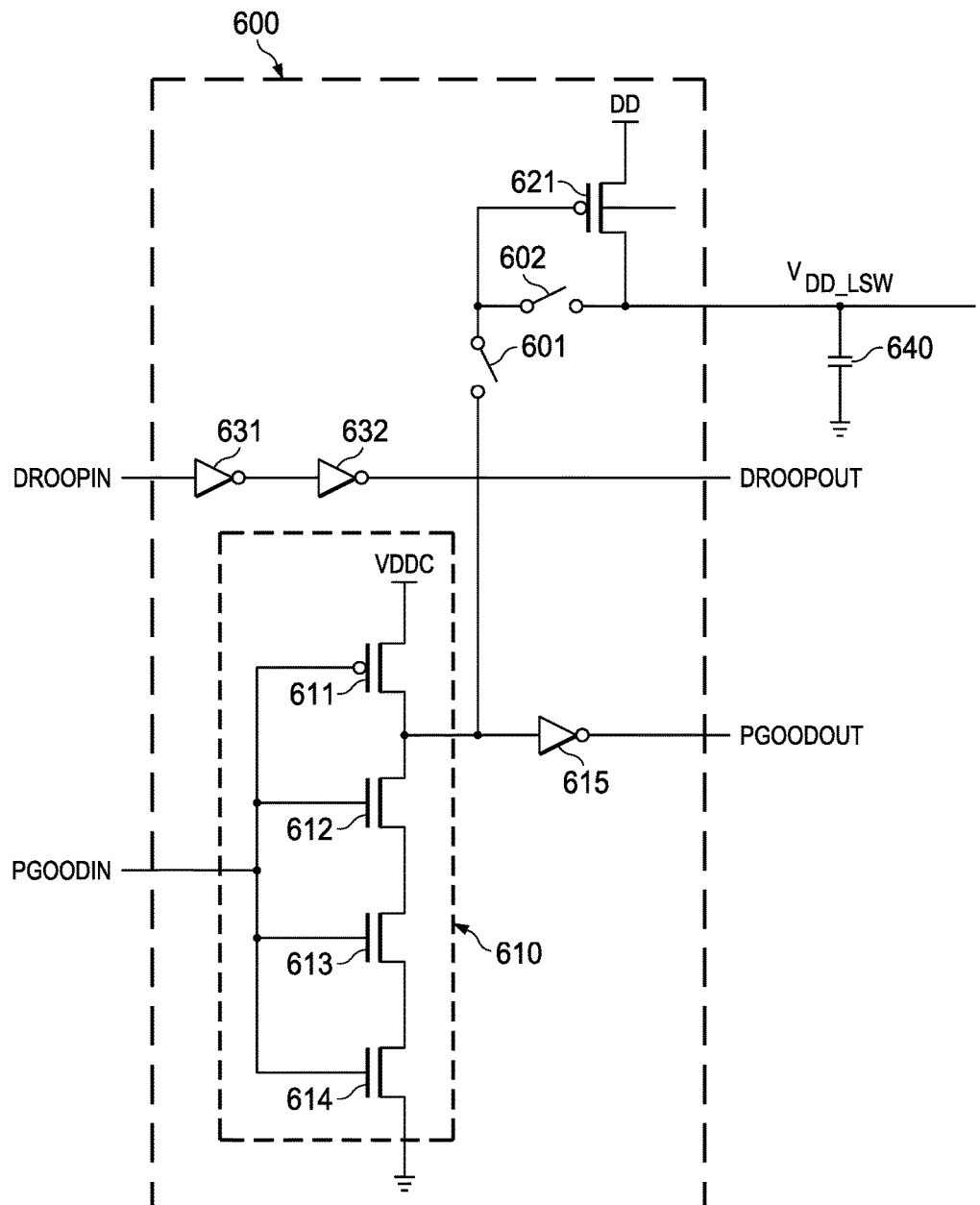
FIG. 6 is a schematic diagram of an embodiment of the power switch including a voltage drooping circuit according to the second embodiment of this invention illustrated in FIG. 4.

FIGS. 4, 5 and 6 illustrate a power switch used on a SOC to implement this invention. FIG. 4 is a block diagram showing the inputs and outputs. Power switch 400 receives a power source $V_{DD}$ and generates a power output $V_{DD\_LSW}$. Power switch 400 receives inputs DROOPIN and PGOODIN which control its operation. Power switch 400 is typically deployed in a chain of power switches connected together. The DROOPOUT output of one power switch supplies the DROOPIN input of a next power switch in the chain. The PGOODOUT output supplies the PGOODIN input of the next power switch in the chain. Power switch 400 operates as shown in Table 2.

TABLE 2

| DROOPIN | PGOODIN | Mode |
|---|---|---|
| 0 | 0 | OFF |
| 0 | 1 | Normal |
| 1 | 0 | Retention Mode |
| 1 | 1 | Retention Mode |

FIG. 5 illustrates an example 500 of the chain of switches 400 employed in the chain. The input signals DROOPIN and PGOODIN are supplied to corresponding inputs of the first power switch in the chain, power switch 510. As previously described, the DROOPOUT output of power switch 510 supplies the DROOPIN input of power switch 520 and the PGOODOUT output of power switch 510 supplies the PGOODIN input of power switch 520. FIG. 5 illustrates three power switches, 510, 520 . . . 570, but more or fewer power switches could be provided within the scope of this invention. Each power switch 510, 520 . . . 570 controls power supplied to a corresponding partition 515, 525 . . . 575 of power domain 505. FIG. 5 illustrates partitions 515, 525 . . . 575, but more or fewer partitions could be provided within the scope of this invention with each partition having a corresponding power switch. The chain of power switches 510, 520 . . . 570 prevents the source of signals PGOODIN and DROOPIN from exceeding a fan out limitation. Note that example 500 illustrated in FIG. 5 corresponds to a single power domain with drooping such as illustrated at 312 and 313 of FIG. 3.

FIG. 6 illustrates an exemplary diagram of circuit 600 implementing power switch 510, 520 . . . 570. The PGOODIN input drives invertor 610 consisting of a series connection of PMOS transistor 611 and NMOS transistors 612, 613 and 614. The PGOODIN input drives a common connection to the gates of PMOS transistor 611 and NMOS transistors 612, 613 and 614. The output of inverter 610, taken from between PMOS transistor 611 and NMOS transistor 612, drives the gate of PMOS transistor 621 in a manner further described below and the input of inverter 615. Due to the nature of PMOS and NMOS transistors, PMOS transistor 611 is conductive opposite to NMOS transistors 612, 613 and 614. Switches 601 and 602 control operation of circuit 600 in a manner detailed below.

The source-drain channel of PMOS transistor 621 is connected between the $V_{DD}$ input and the $V_{DD\_LSW}$ output. The gate of PMOS transistor 621 is connected to the output of inverter 610 through switch 601. Assuming that switch 601 is closed and switch 602 is open (DROOPIN=0), PMOS transistor 621 connects $V_{DD}$ to $V_{DD\_LSW}$ on a 1 input on PGOODIN. PMOS transistor 612 isolates $V_{DD}$ from $V_{DD\_LSW}$ on a 0 input on PGOODIN. Inverter 615 assures that the output PGOODOUT has the same digital sense as input PGOODIN to drive the next power switch in the chain. Capacitor 640 smoothes the output $V_{DD\_LSW}$.

The DROOPIN input signal is supplied to the input of inverter 631. The output of inverter 631 is supplied to the input of inverter 632. Inverter 632 assures that the output DROOPOUT has the same digital sense as input DROOPIN to drive the next power switch in the chain. Switches 601 and 602 are controlled as shown in Table 3.

TABLE 3

| DROOPIN | Switch 601 | Switch 602 |
|---|---|---|
| Inactive (0) | Closed | Open |
| Active (1) | Open | Closed |

Switches 601 and 602 operate oppositely. When switch 601 is closed switch 602 is open and vice versa. When DROOPIN is inactive, switch 601 is closed and switch 602 is open. Circuit 600 operates according to the state of PGOODIN. For PGOODIN=1, circuit 600 supplies electric power to the corresponding partition by connecting the $V_{DD}$ input to the $V_{DD\_LSW}$ output via PMOS 621. For PGOODIN=0, circuit 600 cuts off electric power from the corresponding partition. When DROOPIN is active, switch 601 is open and switch 602 is closed. Circuit 600 is no longer controlled by the state of PGOODIN. Instead, circuit 600 connects electric power to the corresponding partition by connecting the $V_{DD}$ input to the $V_{DD\_LSW}$ output via a diode forward bias drop through the PMOS transistor 621. Thus $V_{DD\_LSW}$ is diode drop (about 0.2 V to 0.3 V) less than $V_{DD}$. This enables the low retention voltage to be applied to the corresponding power module.

Figure 7:
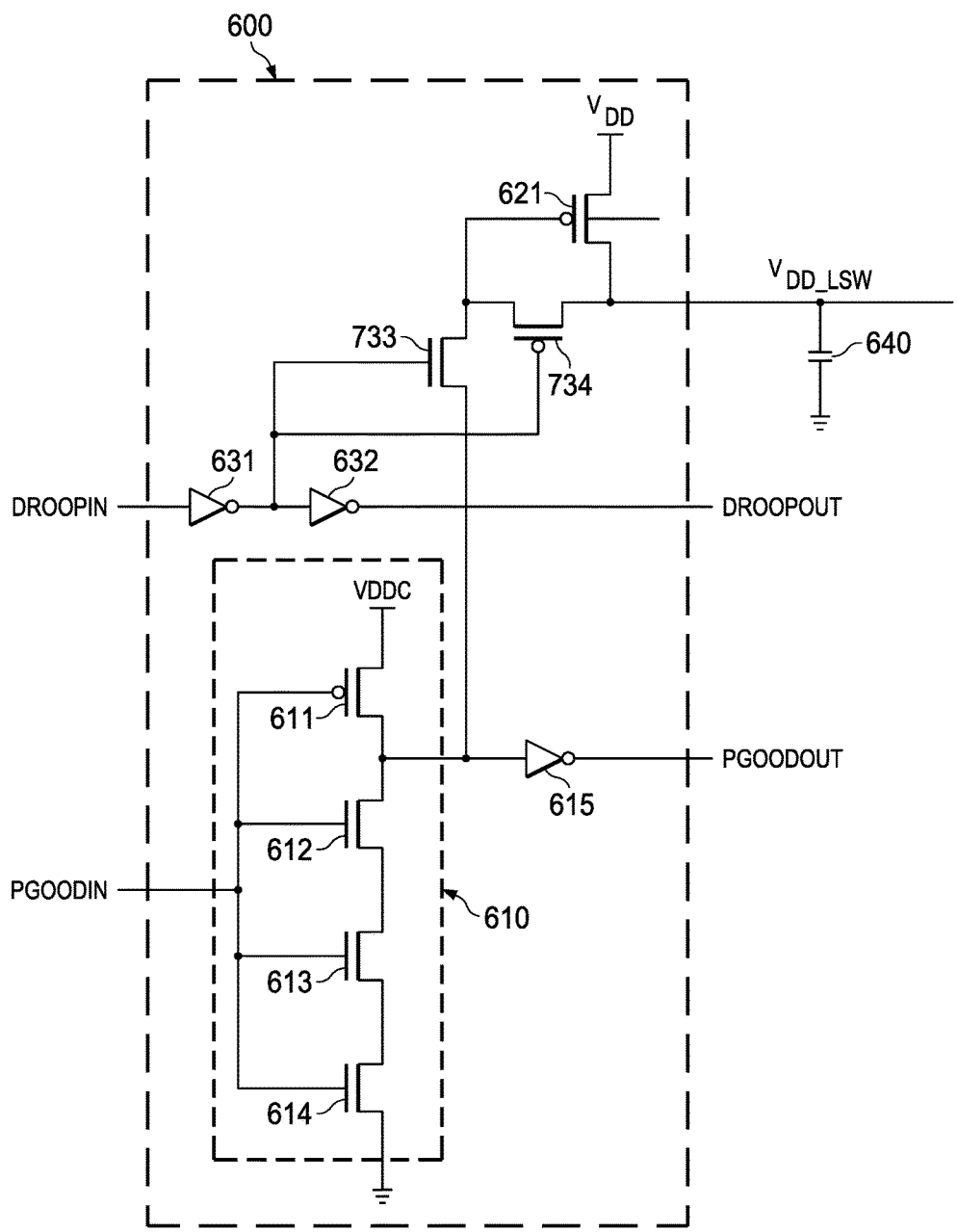
FIG. 7 illustrates a practical embodiment of circuit 600 illustrated in FIG. 6.

FIG. 7. illustrates a practical embodiment of the circuit 600 illustrated in FIG. 6. Switches 601 and 602 are embodied by respective NMOS transistor 733 and PMOS transistor 734. The source-drain path NMOS transistor 733 connects the gate of PMOS transistor 621 to inverter 611 when DROOPIN is inactive (Normal mode) and is open otherwise. This embodies first switch 601. The source-drain path of PMOS transistor 734 connects the gate of PMOS transistor 621 to the second terminal of its source-drain path when DROOPIN is active (Retention mode) and is open otherwise. This embodies second switch 602.

Due to the nature of PMOS and NMOS transistors, NMOS transistor 733 is conductive opposite to PMOS transistor 734. When DROOPIN is 0, NMOS transistor 733 is conducting and NMOS transistor 734 is not conducting. Accordingly, the gate of PMOS transistor 621 is connected to the output of inverter 610 to be driven conductive or non-conductive according to the state of PGOODIN. As shown in Table 2 the corresponding power domain is driven OFF or NORMAL based upon the state of PGOODIN. Note when PGOODIN is 1, PMOS transistor 621 is conductive connecting the $V_{DD}$ input to the $V_{DD\_LSW}$ output. When PGOODIN is 0, PMOS transistor 621 is non-conductive isolating the $V_{DD}$ input from the $V_{DD\_LSW}$ output.

When DROOPIN is 1, NMOS transistor 733 is not conducting and NMOS transistor 734 is conducting. In this situation the state of PGOODIN is not controlling. The source-drain channel of NMOS transistor 734 connected the gate to PMOS transistor 621 to a terminal of its source-drain channel. PMOS transistor 621 connects the $V_{DD}$ input to the $V_{DD\_LSW}$ output via a diode forward bias drop through the PMOS transistor 621. Thus $V_{DD\_LSW}$ is diode drop (about 0.2 V to 0.3 V) less than $V_{DD}$. This enables the low retention voltage to be applied to the corresponding power module.

Selection of an NMOS type for transistor 733 and a PMOS type for transistor 734 is not required. Switch 601 could be embodied by a PMOS transistor. In order to preserve the states shown in Table 3, this PMOS transistor must be driven in an opposite phase than illustrated in FIG. 7. This opposite phase could be a connection of the gate of this transistor directly to DROOPIN at the input of inverter 631 or from the output of inverter 632. Switch 602 could be embodied by an NMOS transistor. This NMOS transistor must be driven in an opposite phase than illustrated in FIG. 7 such as directly by DROOPIN at the input of inverter 631 or from the output of inverter 632. The conductivity type (N channel or P channel) is not important as long as the states conform to Table 3.

Figure 8:
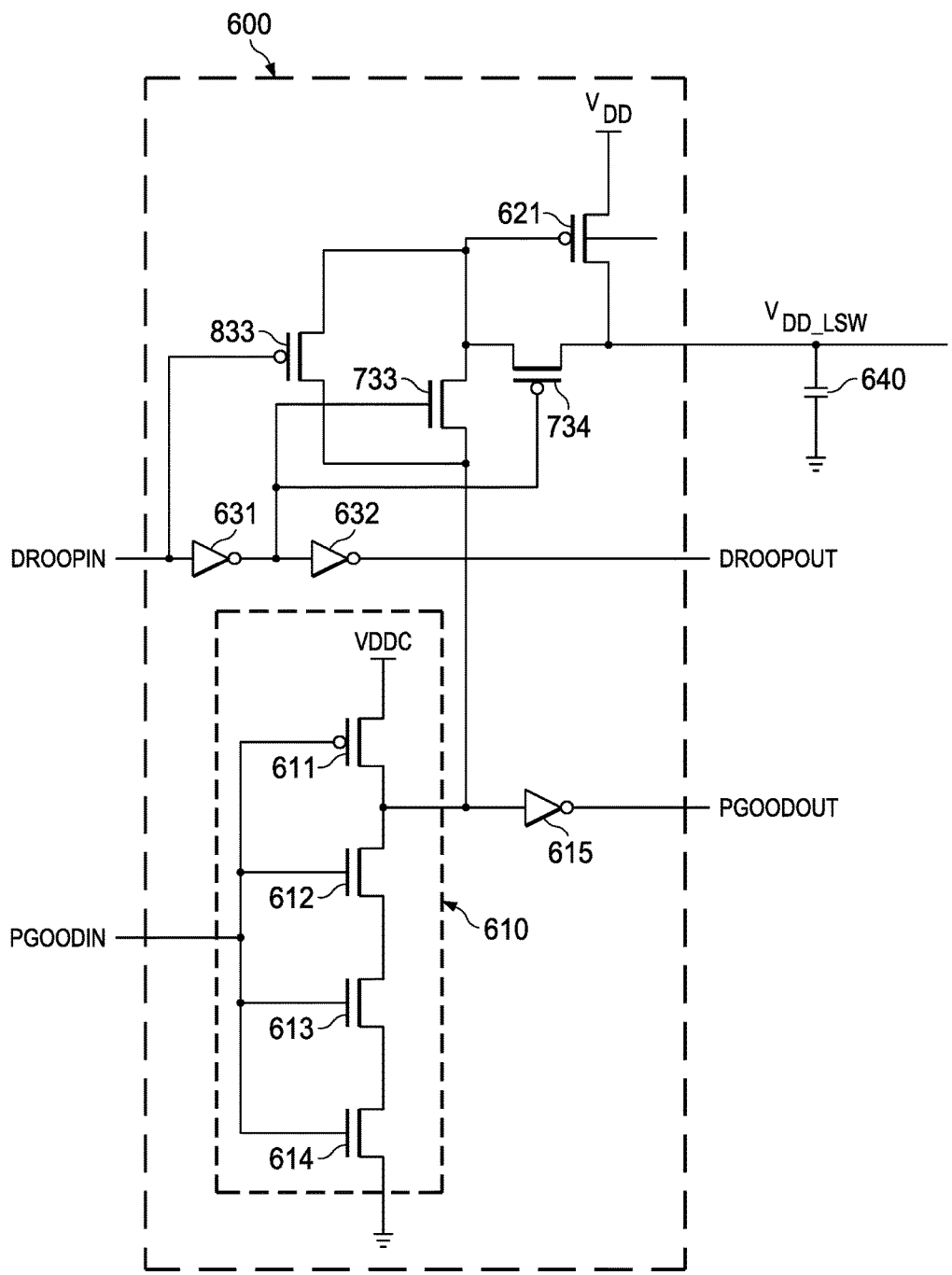
FIG. 8 illustrates another practical embodiment of circuit 600 illustrated in FIG. 6.

FIG. 8 illustrates a further alternative for embodying switch 601. FIG. 8 is similar to FIG. 7 and like parts have like reference numbers. In FIG. 8 switch 601 is embodied by a parallel combination of NMOST transistor 733 and PMOS transistor 833. The gate of PMOS transistor 833 is connected to the DROOPIN input. PMOS transistor 833 pulls up the gate of PMOS transistor 621 to the full supply to turn off PMOS transistor 621 completely when DROOPIN=0 and PGOODIN=0. In the circuit of FIG. 8 NMOS transistor 733 ensures that when DROOPIN=0 and PGOODIN=1 gate of PMOS transistor 621 is fully pulled down to 0 V causing PMOS transistor 621 to fully conduct.

This embodiment of the invention does not require extra power supplies brought on-chip nor specialized register cell designs. Such specialized register cell designs are common across almost all other retention solutions. Such specialized register cell designs typically bring some additional complexity to those circuits including specialized clocking and control signaling or both. This embodiment of the invention uses a single custom power switch design with almost any standard cell library. Such power switches are robustly designed with respect to process, temperature and voltage (PTV) variations. This is the key differentiator of this solution.

This embodiment of the invention requires only one standard cell change in the power switch. Thus the design effort to adopt this embodiment of the invention is very low. Since this embodiment of the invention uses the power switch itself as the diode in the source biased mode, there is no additional area incurred in the power switch implementation.

What is claimed is:

1. A method of powering an electronic circuit having at least one flip-flop having two states comprising the steps of:
   producing a first voltage sufficient for the electronic circuit to operate and for an at least one flip-flop to retain its state employing a first voltage regulator connected to a power supply having a voltage at least as great as said first voltage;
   producing a second voltage less than said first voltage, said second voltage sufficient for said at least one flip-flop to retain its state but not sufficient to guarantee the electronic circuit to operate via a voltage drop from the first voltage;
   powering the electronic circuit with said first voltage during a normal operation mode; and
   powering the electronic circuit with said second voltage during a reduced power retention mode.

2. An electronic circuit comprising:
a circuit module including logic for performing a useful function and at least one flip-flop having two states, said circuit module including a power input terminal;
a voltage regulator connected to a power supply generating a first voltage sufficient for said logic to operate and for said at least one flip-flop to retain its state in said circuit module;
a droop switch circuit connected to said voltage regulator and said circuit module, supplying said circuit module with said first voltage during a normal operation mode and supplying said circuit module with a second voltage produced by decreasing said first voltage during a reduced power retention mode, said second voltage sufficient for said at least one flip-flop to retain its state but not sufficient to guarantee said logic to operate in said circuit module.

3. A method of powering an electronic circuit having at least one flip-flop having to states comprising the steps of:
producing a first voltage sufficient for the electronic circuit to operate and for an at least one flip-flop to retain its state;
connecting the first voltage to a power input of the electronic circuit via a source-drain channel of a MOS transistor;
during a normal operation mode turning the MOS transistor fully ON by application of an appropriate signal at a gate of the MOS transistor thereby supplying the first voltage to the electronic circuit; and
during a reduced power retention mode connecting the gate the MOS transistor to one terminal of the source-drain channel of the MOS transistor thereby supplying a low retention voltage, lower han the first voltage, to the electronic circuit.

4. An electronic circuit comprising:
a circuit module including logic for performing a useful function and at least one flip-flop having two states, said circuit module including a power input terminal;
a voltage regulator connected to a power supply generating a first voltage sufficient for said logic to operate and for said at least one flip-flop to retain its state in said circuit module;
a droop switch circuit connected to said voltage regulator and said circuit module, said droop switch circuit including
a first PMOS transistor having a source-drain channel connected between said first voltage and said power input terminal of said circuit module and a gate,
an NMOS transistor having a first terminal of a source-drain channel connected to said gate of said first PMOS transistor, a second terminal of the source-drain channel and a gate,
a second PMOS transistor having a first terminal of a source-drain channel connected to said gate of said first PMOS transistor, a second terminal of a source-drain channel connected to said power input of said circuit module and a gate,
a first inverter having an input receiving a signal having a first digital state for a normal operation mode and a second opposite digital state for a reduced power retention mode and an output connected to said gate of said NMOS transistor and said gate of said second PMOS transistor whereby for said normal operation mode said second PMOS transistor is ON and said NMOS transistor is OFF and for said reduced power retention mode said NMOS transistor is ON and said second PMOS transistor is OFF, and
a second inverter having an input receiving a signal having said first digital state for ON operation and said second digital state for OFF operation, and an output connected to said second terminal of the source-drain channel of said NMOS transistor.

5. The electronic circuit of claim 4, further comprising:
a third PMOS transistor having a first terminal of a source-drain channel connected to said gate of said first PMOS transistor, a second terminal of a source-drain channel connected to said output of said second inverter and a gate connected to said input of said inverter whereby for said normal operation mode said third PMOS transistor is ON and for said reduced power retention mode said third PMOS transistor is OFF.

6. An electronic circuit comprising:
a plurality of circuit modules, each circuit module including logic for performing a useful function and at least one flip-flop having two states, each circuit module including a power input terminal;
a voltage regulator connected to a power supply generating a first voltage sufficient for said logic to operate and for said at least one flip-flop to retain its state in said plurality of circuit modules;
a plurality of droop switch circuits equal in number to a number of said plurality of circuit modules, each droop switch circuit connected to said voltage regulator and said power input terminal of a corresponding circuit module, each droop switch circuit including a Normal/Power Retention mode input terminal, a Normal/Power Retention mode output terminal, an ON/OFF mode input terminal and an ON/OFF mode output terminal, each droop switch circuit including
a first PMOS transistor having a source-drain channel connected between said first voltage and said power input terminal of said corresponding circuit module and a gate,
an NMOS transistor having a first terminal of a source-drain channel connected to said gate of said first PMOS transistor, a second terminal of the source-drain channel and a gate,
a second PMOS transistor having a first terminal of a source-drain channel connected to said gate of said first PMOS transistor, a second terminal of a source-drain channel connected to said power input of said circuit module and a gate,
a first inverter having an input connected to said Normal/Power Retention mode input terminal and an output connected to said gate of said NMOS transistor and said gate of said second PMOS transistor whereby for said normal operation mode said second PMOS transistor is ON and said NMOS transistor is OFF and for said reduced power retention mode said NMOS transistor is ON and said second PMOS transistor is OFF,
a second inverter having an input connected to said output of said first inverter and an output connected to said Normal/Power Retention mode output terminal,
a third inverter having an input connected to said ON/OFF mode input terminal and an output connected to said second terminal of the source-drain channel of said NMOS transistor, and
a fourth inverter having an input connected to said output of said third inverter and an output connected to said ON/OFF mode output terminal;

wherein said plurality of droop switch circuits are disposed in a sequence with a first droop switch circuit and a last droop switch circuit, said first droop switch circuit receiving a Normal/Retention Mode signal on said Normal/Retention Mode input terminal and receiving an ON/OFF Mode signal on said ON/OFF Mode input terminal, each droop switch circuit other than said first droop switch having said Normal/Retention Mode input terminal connected to said Normal/Retention Mode output terminal of an immediately prior droop switch circuit in said sequence and said ON/OFF mode input terminal connected said ON/OFF mode output terminal of an immediately prior droop switch circuit in said sequence.

7. The electronic circuit of claim 6 further comprising:
a third PMOS transistor having a first terminal of a source-drain channel connected to said gate of said first PMOS transistor, a second terminal of a source-drain channel connected to said output of said second inverter and a gate connected to said input of said inverter whereby for said normal operation mode said third PMOS transistor is ON and for said reduced power retention mode said third PMOS transistor is OFF.

\* \* \* \* \*